(12) United States Patent
Kim

(10) Patent No.: US 7,613,029 B2
(45) Date of Patent: Nov. 3, 2009

(54) PHASE CHANGE MEMORY AND METHOD FOR DRIVING THE SAME

(75) Inventor: Kwang Jean Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 53 days.

(21) Appl. No.: 11/641,033

(22) Filed: Dec. 19, 2006

(65) Prior Publication Data

US 2007/0147109 A1    Jun. 28, 2007

(30) Foreign Application Priority Data

Dec. 28, 2005    (KR) .................. 10-2005-0132254

(51) Int. Cl.
*G11C 11/00*    (2006.01)
(52) U.S. Cl. ..................... 365/148; 365/46; 365/100
(58) Field of Classification Search ............... 365/148, 365/163; 438/95, 96, 365; 257/2–5
See application file for complete search history.

(56) References Cited

OTHER PUBLICATIONS

Non-Volatile Memory Based on Solid Electrolytes, IEEE Non-Volatile Memory Technology Symposium, at Orlando, FL, Nov. 15-17, 2004.*

* cited by examiner

*Primary Examiner*—Son Dinh
*Assistant Examiner*—Harry W Byrne
(74) *Attorney, Agent, or Firm*—Lowe Hauptman Ham & Berner, LLP

(57) ABSTRACT

A phase change memory has a first electrode formed over a substrate, a patterned phase change material layer formed over the first electrode to contact the first electrode and including a conductive material, and a second electrode formed over the patterned phase change material layer to contact the patterned phase change material layer. Instead of heat generation, the conductive channel is used to adjust resistance while maintaining characteristics of non-volatile memories. Hence, the power consumption can be reduced. Due to no use of the phase change, the shortened lifetime of equipment for fabricating semiconductor memories, usually caused by a volume change during the phase change, can be reduced.

8 Claims, 3 Drawing Sheets

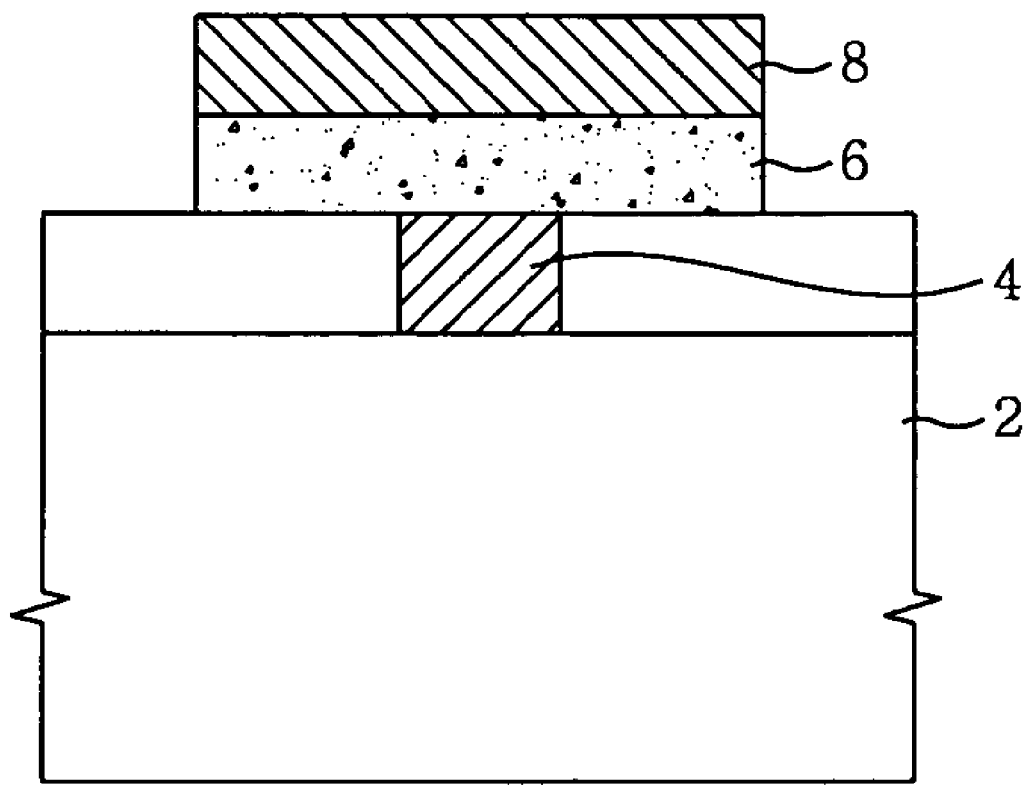

US 7,613,029 B2

PHASE CHANGE MEMORY AND METHOD FOR DRIVING THE SAME

FIELD OF THE INVENTION

The present invention relates to a semiconductor memory, and more particularly, to a phase change memory capable of reducing power consumption caused by a phase change, and a method for driving the same.

BACKGROUND OF THE INVENTION

Semiconductor memories can be classified into volatile memory and non-volatile memory depending on the retention of data when the power is turned off. A direct random access memory (DRAM) and a static random access memory (SRAM) are exemplary representative volatile memories, and a flash memory is one exemplary representative non-volatile memory. These typical RAMs have a logic value of '0' or '1' depending on the presence or absence of charges stored thereon so as to provide various functions as a memory.

In general, DRAMs, which are volatile memories, require periodic refresh and high charge storage capability (i.e., capacitance). Many attempts have been made to increase the capacitance of DRAMs. For instance, the surface area of a capacitor electrode may be increased to increase its capacitance. However, increasing the surface area of the capacitor electrode may cause a limitation in increasing the scale of integration of DRAMs.

On the other hand, a flash memory is usually configured with gate structures, each including a gate insulation layer, a floating gate, a dielectric layer, and a control gate, which are formed on a substrate in sequential order. A flash memory writes or erases data by charge tunneling through the gate insulation layer. The writing and erasing operations usually require an operation voltage higher than a power supply voltage. Thus, a flash memory generally requires a boosting circuit to generate a voltage necessary for writing and erasing data.

Intensive research has been and is being conducted to develop a memory that, while having the characteristics of non-volatile memories, allows certain access and increases the scale of integration yet retains a simple structure. A phase change RAM (PRAM) is one representative example of such a memory. In general, a phase change memory uses a phase change material whose phase changes depending on heat supplied thereto. A chalcogen compound including germanium (Ge), antimony (Sb) and tellurium (Te), which is typically labeled as GST or Ge—Sb—Te, may be used as the phase change material. Current flows through a layer of the phase change material to generate heat in the phase change material. Depending on the amount of current and the supply time, a phase change may result in the phase change material (e.g., GST).

Certain information can be based on the unique properties of the phase change materials used. For example, GST exhibits different levels of resistance depending on its phase, more specifically, GST is characterized by a relatively low resistance when in a crystalline phase and a relatively high resistance when in an amorphous phase. Logic information can be determined based on the resistance difference.

Stated differently, when a current pulse with large magnitude (e.g., resistance heat) is applied to a phase change material layer for a short period of time such that the phase change material layer is heated up to its melting point and then allowed to cool within a short period (e.g., $1_{ns}$ or less), a portion of the phase change material layer that has been heated changes its phase into an amorphous phase (e.g., a reset state). In contrast, when a current pulse with small magnitude is applied to a phase change material layer for a long period such that it maintains a crystallization temperature lower than the melting point thereof and is then coolled, a portion of the phase change material layer that has been heated changes its phase into a crystalline state (e.g., a set state).

FIG. 1 illustrates a sectional view of a typical phase change memory, e.g., a phase change RAM. A first electrode layer 4 is formed on a substrate 2, and a patterned phase change material layer 6 is formed on the first electrode layer 4. A second electrode 8 is formed on the patterned phase change material layer 6.

However, when the patterned phase change material layer 6 changes its phase from a crystalline phase to an amorphous phase, heat generated in the phase change material layer often causes erroneous operations of the phase change RAM. This may occur because this type of phase change generally requires high energy.

In addition, the volume of a phase change material may not return to the original volume resulting in volume changes with each phase change. Consequently, the lifetime of the phase change memories may be shortened.

SUMMARY OF THE INVENTION

In accordance with one preferred embodiment of the present invention, there is provided a phase change memory including a first electrode formed over a substrate, a patterned phase change material layer formed over the first electrode to contact the first electrode and including a conductive material, and a second electrode formed over the patterned phase change material layer to contact the patterned phase change material layer.

In accordance with another preferred embodiment of the present invention, there is provided a method for operating a phase change memory, wherein the phase change memory includes a first electrode formed over a substrate, a patterned phase change material layer formed over the first electrode to contact the first electrode and including a conductive material, and a second electrode formed over the patterned phase change material layer to contact the patterned phase change material layer, the method including applying a certain voltage to the first and second electrodes to form a conductive channel inside the patterned phase change material layer; and applying a certain inverse voltage to the first and second electrodes to make the conductive channel disappear.

It is an object of the present invention to provide a phase change memory that can reduce power consumption due to a phase change by forming a channel through which electrons is transferred within a phase change material instead of causing a phase of the phase change material to change, and a method for driving the same.

BRIEF DESCRIPTION OF THE DRAWINGS

The above and other objects and features of the present invention will become apparent from the following description of preferred embodiments given in conjunction with the accompanying drawings, in which:

FIG. 1 illustrates a sectional view of a typical phase change memory; and

DETAILED DESCRIPTION OF THE PREFERRED EMBODIMENTS

Hereinafter, preferred embodiments of the present invention will be described in detail with reference to the accompanying drawings.

Figure 2A:
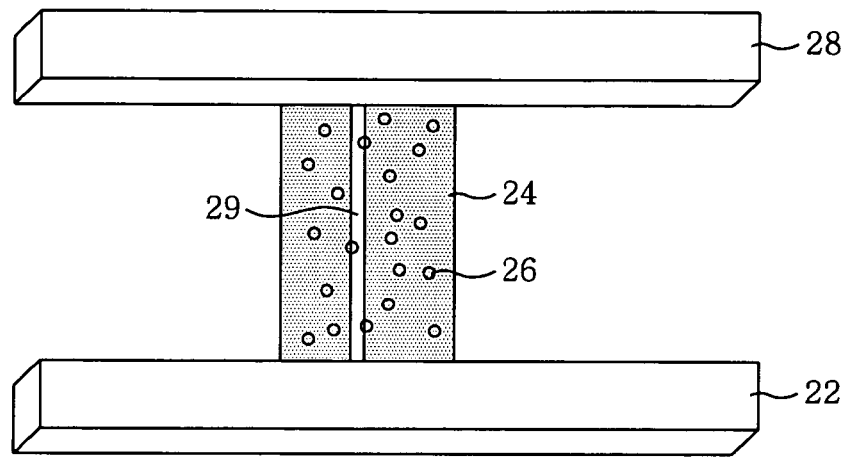
FIGS. 2A, 2B and 2C are schematic diagrams to illustrate a method for operating a phase change memory in accordance with certain embodiments of the present invention.
Figure 2B:
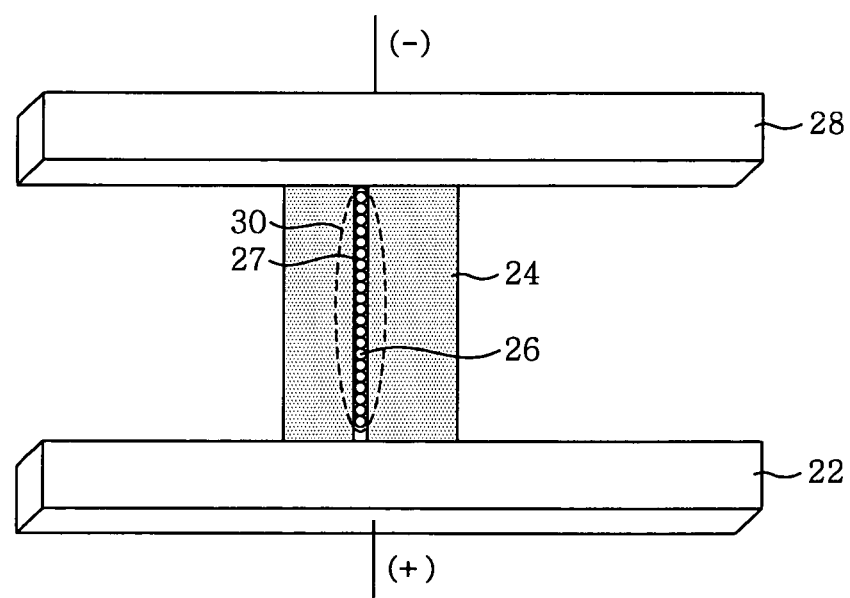
Figure 2C:
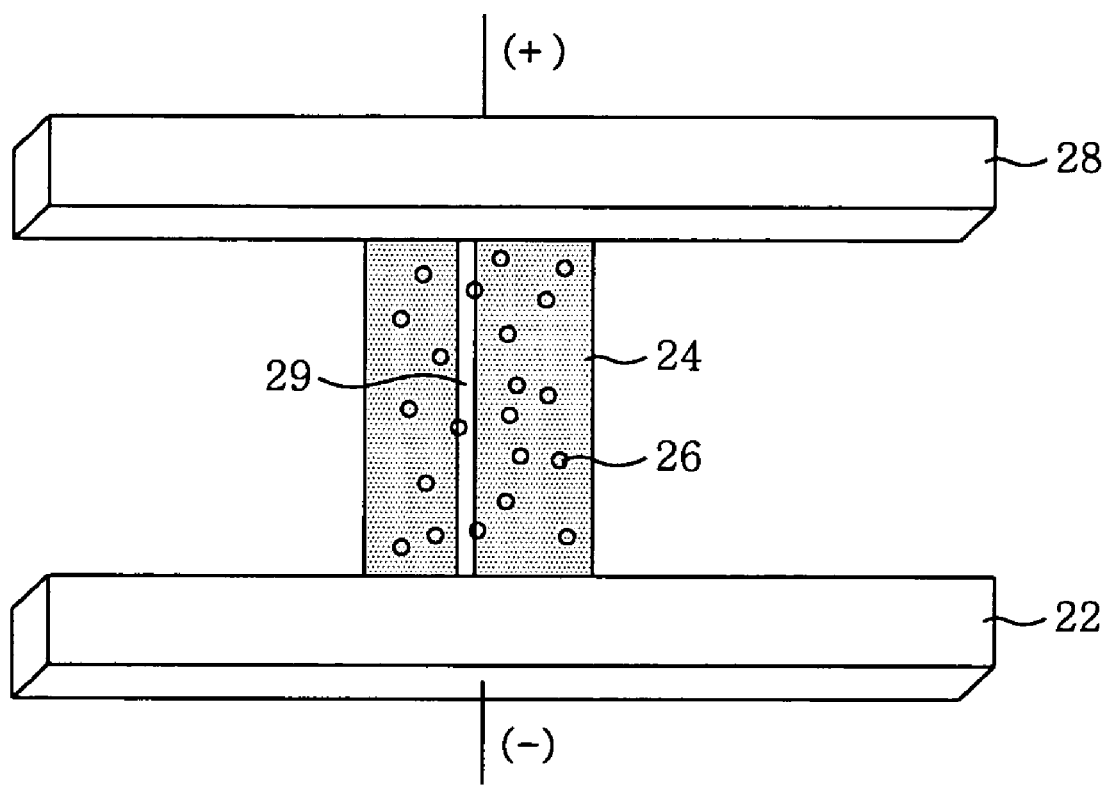

FIGS. 2A, 2B and 2C are schematic diagrams to illustrate a method for operating a phase change memory (e.g., phase change RAM) in accordance with an embodiment of the present invention. Particularly, FIGS. 2A, 2B and 2C illustrate enlarged views of a first electrode layer, a patterned phase change layer and a second electrode layer as similarly shown in FIG. 1.

FIG. 2A shows a first electrode layer 22, a patterned phase change material layer 24, a conductive material 26, a second electrode layer 28, and a grain boundary 29. In accordance with one embodiment of the present invention, the first electrode layer 22 is formed over a substrate (not shown). Various conductive materials may be used to form the first electrode layer 22. For instance, the first electrode layer 22 includes one or more selected from a conductive material group consisting of tungsten (W), carbon (C), copper (Cu), aluminum (Al), tungsten silicide (WSi), platinum (Pt), silver (Ag), gold (Au), titanium (Ti), titanium nitride (TiN), and doped polysilicon. The patterned phase change material layer 24 is formed over the first electrode layer 22 to contact the first electrode layer 22. The patterned phase change material layer 24 may preferably include a conductive material 26. As mentioned above, a material used to form the patterned phase change material layer 24 changes a phase of the material depending on heat. Typically, chalcogen compounds usually based on Ge, Sb and Te (i.e., GST or Ge—Sb—Te) are used to form the patterned phase change material layer 24. A grain boundary 29 where the phase change material sparsely exists is formed in the patterned phase change material layer 24.

The second electrode layer 28 is formed over the patterned phase change material layer 24 such that the second electrode layer 28 contacts the patterned phase change material layer 24.

Because the patterned phase change material layer 24 may include the conductive material 26, when a certain voltage is applied thereto, a channel 30 (i.e., the current path, shown in FIG. 2B) through which electrons can pass is generated due to convergence of components of the conductive material 26. As a result, resistance decreases.

The phase change RAM in accordance with one embodiment of the present invention operates as follows.

As shown in FIG. 2A, when a voltage is not applied, the components of the conductive material 26 included in the patterned phase change material 24 are uniformly distributed throughout. Although a hopping event may occur, the patterned phase change material layer 24 has high resistance because a channel through which electrons are transferred directly is not formed. For example, the patterned phase change material layer 24 may have a resistance of approximately $10^8$ to $10^{10}$.

Referring to FIG. 2B, when a voltage lower than a threshold voltage is applied to the first and second electrodes 22 and 28, the conductive material 26 starts to form a channel 30 along the grain boundary 29 of the patterned phase change material layer 24. A suitable voltage that is lower than the threshold voltage may be in a range of approximately 1.2V to 1.5V. That is, when a positive(+) voltage is applied to the first electrode 22, while a negative(−) voltage is applied to the second electrode 28, electrons transfer from the second electrode 28 to the first electrode 22 through the channel 30. Thus, resistance of the patterned phase change material layer 24 can be decreases.

Referring now to FIG. 2C, when an inverse voltage is applied to corresponding first and second electrodes 22 and 28 while the conductive channel 30 is formed (as illustrated in FIG. 2B) (the components of the conductive material 26 are scattered. As a result, the channel 30 (i.e., the current path) disappears, resulting in increasing the resistance. Due to repetition of the above operations, writing and erasing certain data are enabled.

In another embodiment of the present invention, instead of using heat generation to induce the phase change memory (e.g., phase change RAM), a conductive channel may be used to adjust a resistance value while maintaining characteristics of non-volatile memories. As a result, the power consumption can be reduced.

In addition, because the phase change RAM in accordance with the exemplary embodiments disclosed herein does not use the typical phase change mechanism, it is possible to prevent the shortened lifetime of equipment for fabricating semiconductor memories usually caused by a change in volume during the phase change.

While the invention has been shown and described with respect to the preferred embodiments, it will be understood by those skilled in the art that various changes and modifications may be made without departing from the spirit and scope of the invention as defined in the following claims.

What is claimed is:

1. A random access memory comprising:
    a first electrode formed over a substrate;
    a patterned phase change material layer defining a grain boundary therein, said phase change material layer formed over the first electrode to contact the first electrode and including a conductive material; and
    a second electrode formed over the patterned phase change material layer to contact the patterned phase change material layer, wherein
    a concentration of the phase change material along the grain boundary is sparse; and
    said grain boundary is in direct contact with the first and second electrodes and extends continuously and essentially linearly therebetween.

2. The random access memory of claim 1, wherein when a voltage is applied between the first and second electrodes, a conductive channel is formed inside the patterned phase change material layer, the channel extending along the grain boundary.

3. The random access memory of claim 2, wherein the first electrode and the second electrode are applied with a positive voltage and a negative voltage, respectively.

4. The random access memory of claim 2, wherein the channel is formed along the grain boundary defined inside the patterned phase change material layer.

5. The phase change memory of claim 2, wherein when an inverse voltage is applied to the first and second electrodes, the channel is eliminated.

6. A method for operating a random access memory, wherein the random access memory includes a first electrode formed over a substrate, a patterned phase change material layer formed over the first electrode to contact the first electrode and including a conductive material, and a second electrode formed over the patterned phase change material layer to contact the patterned phase change material layer, the method comprising:

forming a continuous conductive channel which extends essentially linearly from the first electrode to the second electrode through the patterned phase change material layer by applying a voltage to the first and second electrodes;

eliminating the conductive channel by applying an inverse voltage to the first and second electrodes, wherein when forming the conductive channel, components of the phase change material converge thereby decreasing a resistance of the phase change material.

7. The method of claim 6, wherein when forming the conductive channel, the first electrode is applied with a positive voltage and the second electrode is applied with a negative voltage.

8. The method of claim 6, wherein the conductive channel is formed along a grain boundary which extends essentially directly and continuously from the first electrode to the second electrode within the patterned phase change material layer.

* * * * *